(12) United States Patent
Nichols

(10) Patent No.: US 7,088,794 B2
(45) Date of Patent: Aug. 8, 2006

(54) AUTOMATIC GAIN CONTROL FOR DIGITIZED RF SIGNAL PROCESSING

(75) Inventor: Gregory M. Nichols, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 657 days.

(21) Appl. No.: 10/077,730

(22) Filed: Feb. 19, 2002

(65) Prior Publication Data

US 2003/0156666 A1  Aug. 21, 2003

(51) Int. Cl.
H03D 3/24  (2006.01)

(52) U.S. Cl. ............... 375/345; 341/139; 375/316; 455/138

(58) Field of Classification Search ........... 341/139; 342/92; 370/201, 214; 375/222, 257, 345, 375/316; 455/138
See application file for complete search history.

(56) References Cited

U.S. PATENT DOCUMENTS

| | | | |
|---|---|---|---|
| 3,936,819 A | | 2/1976 | Angelle et al. |
| 4,831,378 A | | 5/1989 | Baars et al. |
| 5,161,170 A | | 11/1992 | Gilbert et al. |
| 5,276,685 A | | 1/1994 | Kepler et al. |
| 5,528,633 A | * | 6/1996 | Halik et al. ............ 375/326 |
| 6,005,506 A | * | 12/1999 | Bazarjani et al. ......... 341/143 |
| 6,035,001 A | | 3/2000 | Eklund et al. |
| 6,191,725 B1 | | 2/2001 | Lavoie |
| 6,313,885 B1 | * | 11/2001 | Patel et al. ............. 348/725 |
| 6,577,688 B1 | * | 6/2003 | Nease ................... 375/350 |
| 6,639,939 B1 | * | 10/2003 | Naden et al. ............ 375/140 |
| 6,671,308 B1 | * | 12/2003 | Lomp ................... 375/130 |

* cited by examiner

*Primary Examiner*—Jean B. Corrielus
*Assistant Examiner*—Erin M. File
(74) *Attorney, Agent, or Firm*—John J. Karasek; L. George Legg

(57) ABSTRACT

An automatic gain control RF signal processor for receiver systems, such as radar intercept receivers, includes an attenuator having an input for receiving an analog RF input signal, an amplifier coupled to the attenuator, a bandpass filter coupled to the amplifier output, a single ADC coupled to the bandpass filter, a digital logic circuit, and a FIFO buffer. The digital logic circuit has an input for receiving the ADC output signal, a first output coupled to a variable gain control input of the attenuator, and a second output. The logic circuit includes signal detection logic for detecting the presence of a pulse within the ADC signal, determining a peak amplitude value of the pulse, and based on the peak amplitude value generating an attenuation value at the first output that is applied to the variable gain control input of the attenuator. The sampling logic averages a number of ADC data samples to determine a moving average pulse amplitude, and compares this moving average pulse amplitude to a processing threshold value to determine a delta value with which to adjust an attenuation value for the attenuator, and to determine when to terminate a pulse and reset the attenuation value to zero. The averaging is carried out to determine whether an assigned number m of n samples is above the processing threshold value or whether the pulse should be terminated.

19 Claims, 4 Drawing Sheets

AUTOMATIC GAIN CONTROL FOR DIGITIZED RF SIGNAL PROCESSING

TECHNICAL FIELD

This invention relates to a method and device for automatic gain control in an RF signal processing system. More particularly, the invention relates to the detection and digitized processing of intercepted radar signals.

BACKGROUND ART

RF signal processors typically require automatic gain control (AGC) in order to detect and process RF signals that may vary over a wide range of signal strength. Radar and communications receiver systems generally include (1) an antenna, either directional or omnidirectional, (2) a superheterodyne receiver for tuning to a specific RF and converting to an intermediate frequency (IF), (3) a processor for detecting IF signals and for extracting information from these, and (4) a graphical user interface.

Regarding (3), the IF signal detecting and processing component, historically the IF signal has been processed by a combination of analog and digital components. However, recent advancements in technology have allowed direct digitizing of the IF signal using an analog to digital converter (ADC), resulting in a simpler system architecture that may be termed "Direct Digitization Technology" (DDT) which eliminates the bulky and expensive analog components. For example, U.S. Pat. No. 5,161,170 describes a pulse-to-pulse AGC circuit for digital radar intercept receivers. The system, however, includes certain analog components, e.g. a logarithmic amplifier/detector and a track/hold device, and has the above-noted disadvantages regarding such analog-based designs.

Although DDT reduces system size and cost, typical RF receivers have dynamic ranges in excess of 60 dB, whereas currently available ADCs have usable dynamic ranges of 25 to 45 dB. Therefore, it is desirable to include an automatic gain control (AGC) circuit in front of the ADC to continuously adjust the signal level to be within the dynamic range of the ADC.

U.S. Pat. No. 5,276,685 shows an example of a digital design that implements AGC in a digital quadrature RF receiver. Although the system utilizes digital instead of analog components, these are selected for implementation in a personal communications system (PCS) receiver and are not optimized or well-suited for detecting and processing radar signals.

Another digital system described in U.S. Pat. No. 6,191,725 is directed to an AGC circuit for processing radar signals. The circuit utilizes digital components but requires multiple analog to digital converters (ADCs) operating in parallel to accomplish AGC, increasing the cost and the complexity of the system.

There is, therefore, a need for a digitized RF detection and processing system with fewer components, less complexity, and decreased cost.

DISCLOSURE OF THE INVENTION

According to the invention, an automatic gain control RF signal processor for receiver systems, such as radar intercept receivers, includes an attenuator having an input for receiving an analog RF input signal, an amplifier coupled to the attenuator, a bandpass filter coupled to the amplifier output, a single ADC coupled to the bandpass filter, a digital logic circuit, and a FIFO buffer. The digital logic circuit has an input for receiving the ADC output signal, a first output coupled to a variable gain control input of the attenuator, and a second output. The logic circuit includes signal detection logic for detecting the presence of a pulse within the ADC signal, determining a peak amplitude value of the pulse, and based on the peak amplitude value generating an attenuation value at the first output that is applied to the variable gain control input of the attenuator. The sampling logic averages a number of ADC data samples to determine a moving average of the ADC data samples, and compares the moving average of the ADC data samples to threshold values to detect the presence of a pulse and determine when to initiate and when to terminate storage of ADC sample data. The averaging is carried out to determine whether an assigned number m of n samples is above the processing threshold value or whether the pulse should be terminated.

Also according to the invention, a method of processing an RF input signal includes the steps of receiving an RF signal, inputting the RF signal to the attenuator, applying the attenuator output to an amplifier while controlling a variable gain in the attenuator, passing the amplifier output through a bandpass filter, applying the filtered RF output to an ADC, and applying the digitized ADC output signal to a signal detection logic to determine an attenuation value and to produce a delayed output signal. These steps are then repeated for each of a plurality of ADC data samples. Also, a threshold value is established above which the presence of a pulse within the plurality of ADC data samples is detected, the delayed output signal is applied to a buffer to produce a buffered signal output, and the attenuation value is applied to the attenuator to establish an updated attenuation gain value.

A typical radar signal consists of bursts of RF energy referred to as "pulses." From the perspective of the intercept receiver, these pulses will vary greatly in amplitude with the rotation of the transmitter's antenna. The invention provides an apparatus and method of AGC that allows the intercept system's signal processor to adjust for these changes in amplitude, thereby maintaining acceptable signal amplitude at the ADC. A radar signal environment typically contains multiple signals varying independently in amplitude. The AGC invention is capable of functioning well in such an environment, although performance may degrade somewhat when the pulses of one signal are interlaced with those of another signal.

Additional features and advantages of the present invention will be set forth in, or be apparent from, the detailed description of preferred embodiments which follows.

BEST MODE FOR CARRYING OUT THE INVENTION

Figure 1:
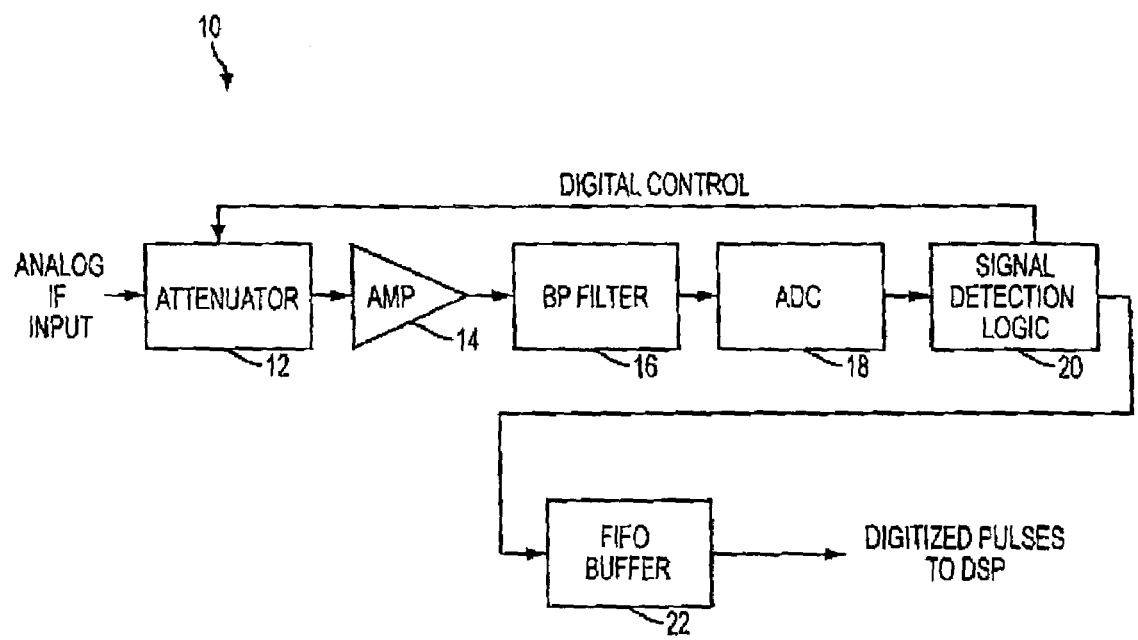
FIG. 1 is a block diagram of a digitized signal processing system according to the invention.

A digitized AGC signal processor 10 is illustrated in FIG. 1. In this circuit, an analog IF input signal, e.g. of a received radar pulse converted to an IF as described above, is applied to a variable-gain front end that consists of a digitally controlled attenuator 12 with its output applied to a fixed amplifier 14.

The output of amplifier 14 goes through a bandpass filter 16 which provides anti-aliasing and noise-reduction functions. The filtered signal is applied to an ADC 18 to produce a digitized output signal that is then applied to a signal detection logic circuit 20. As is further discussed below, circuit 10 preferably employs a ¾ Fs bandpass sampling technique. This technique is preferred over the "synchronous downconverter" approach used in previous art techniques because it eliminates the synchronous downconverter hardware, and it requires only one ADC.

Logic circuit 20 controls the amount of gain setting for attenuator 16 in order to adjust the analog signal level to maximum signal strength without saturating ADC 18. A preferred attenuation value is in the range of from 0 to about 60 dB. In one embodiment of the invention, the IF signal is at 160 MHz with ADC 18 configured to operate at 213.3333 Msps. ADC 18 is preferably a 12-bit rather than an 8-bit device so as to provide adequate dynamic range for AGC circuit 10 to track a typical radar signal as its amplitude increases and decreases.

Upon detecting a pulse in the digitized IF signal, logic circuit 20 writes the pulse to a first-in-first-out (FIFO) buffer 22. As is explained in more detail below, the peak amplitude value is determined and, upon termination of the pulse, the signal flow to FIFO buffer 22 is halted while an attenuation value is programmed into attenuator 16 by means of a lookup table (LUT). The values entered into the LUT may vary according to system design specifications or other considerations, e.g. the resolution of ADC 18, the resolution of attenuator 16, and the expected variance in the pulse-to-pulse input signal amplitude, or other factors or parameters, as is well known in the art.

Figure 2:
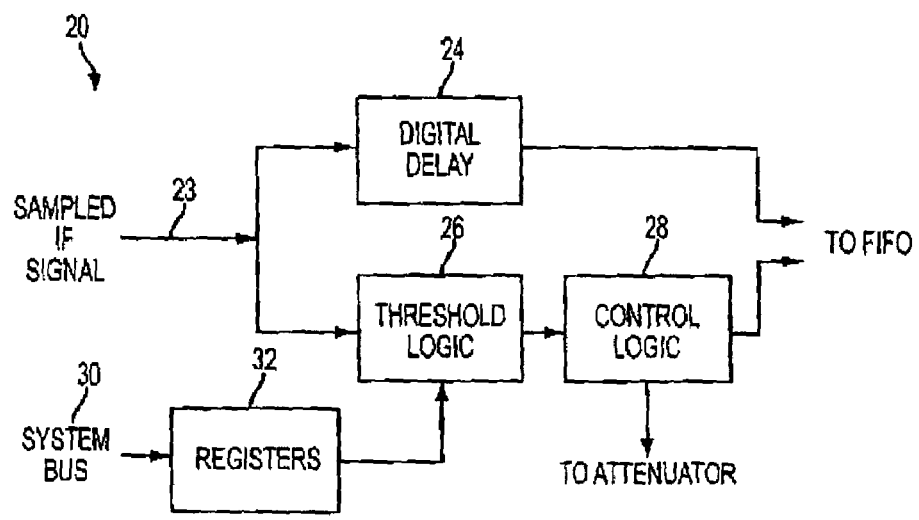
FIG. 2 is a block diagram of a digital control system component according to the invention.

Signal detection logic circuit 20 is illustrated in further detail in FIG. 2. Logic circuit 20 is designed as a Field Programmable Gate Array (FPGA) which provides the designer with a great deal of flexibility when it comes to implementation, testing and refinement of the AGC circuit. A sampled IF signal 23 is applied to a digital delay 24, and to a threshold logic 26 coupled to a control logic 28. Digital delay 24 ensures that the front edge of signal 23 is not missed due to latency in the decision-making process within the threshold and logic control. The digital delay and control logic are implemented such that a fixed number of data samples preceding signal 23 and a fixed number of data samples after signal 23 are stored in FIFO buffer 22. The last data sample in each pulse is assigned a unique bit pattern in FIFO buffer 22. In the event of a continuous wave (CW) signal or a very long pulse, the control logic preferably "times out", i.e. interrupts the FIFO data packet. AGC circuit 10 normally tracks the amplitude of an input signal as it rises and falls. However, special situations can arise where a momentarily strong signal will result in a high attenuation value which, should the signal suddenly disappear, would cause circuit 10 to miss weaker signals. It is therefore preferred that upon no pulses being detected within a predetermined time interval, control logic 28 incrementally reduces the attenuation value until a signal is again detected.

A system bus 30, e.g. a VME-Bus or CompactPCI, provides access to registers 32 to store threshold values established by a host system (not illustrated). A preferred threshold logic is a dual threshold scheme that includes both a noise threshold and a processing threshold. The noise threshold is preferably set to a value just above the minimum noise level of the RF receiver. The processing threshold is preferably set to a higher value which establishes the minimum signal level for signal processing to occur. Detection preferably occurs only when a selected number of consecutive data samples have been received that are above the threshold, or alternatively when a selected percentage or number of "m" out of "n" data samples are above threshold.

Logic circuit 20 preferably further includes a second pair of registers defining the upper and lower bounds of attenuation. These are preferably set initially to values that allow for the widest range of AGC operation. These may be adjusted as necessary by the system operator. For example, upon receiving both very strong and very weak signals, the operator may elect to capture data from one or the other but not both.

Figure 4:
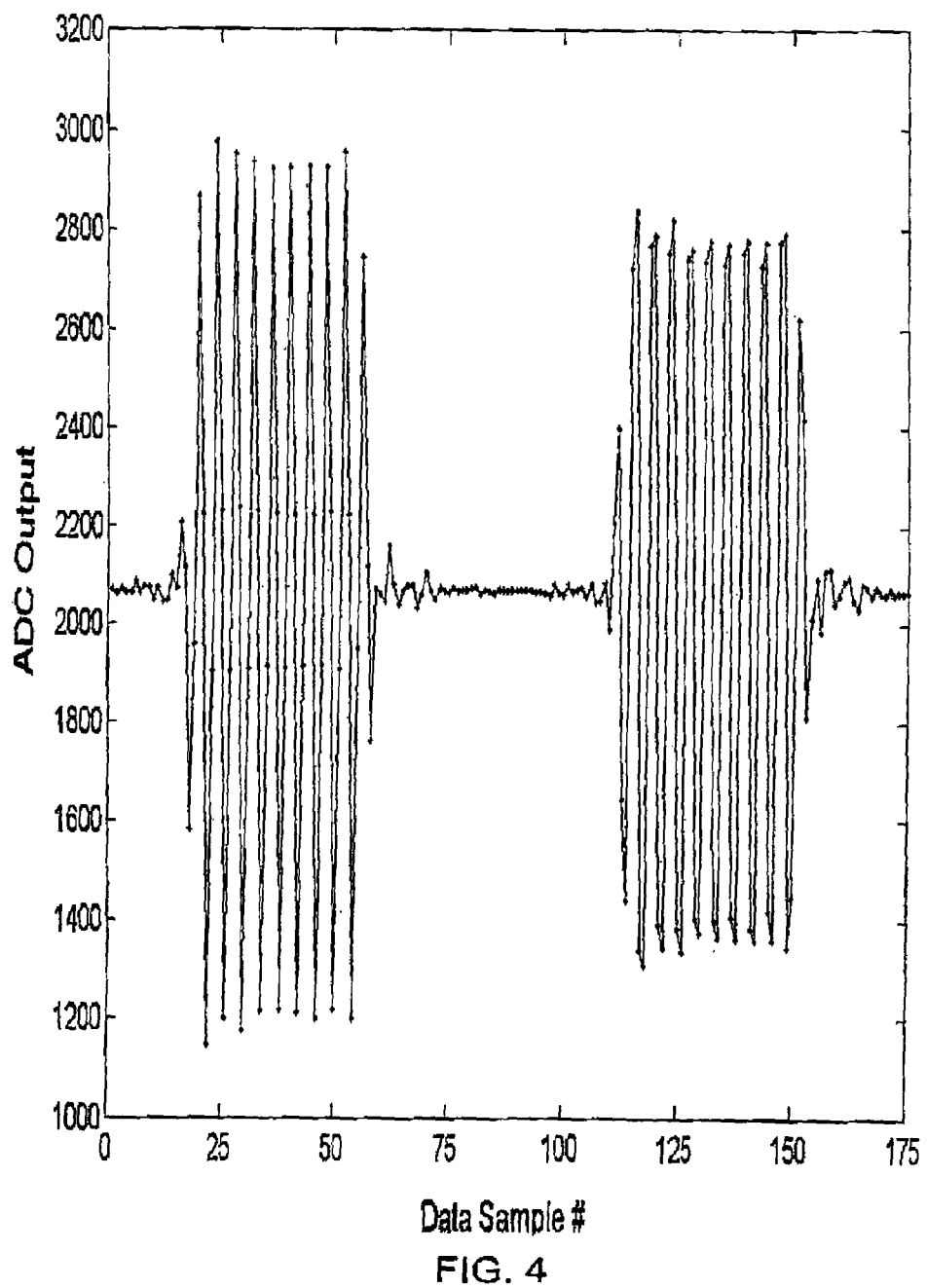
FIG. 4 is a graph illustrating typical ADC data samples according to the invention

Electronic warfare (EW) applications typically supply analog IF outputs on 70 or 160 MHz carrier frequencies. By using a ¾ Fs bandpass sampling technique, these IF signals can be digitized at sample rates of 93.3333 Msps and 213.3333 Msps, respectively. This results in approximately four data samples for each period of the IF waveform, as illustrated in FIG. 4 which shows an example of such a digitized waveform. Upon processing this data with a Digital Signal Processor (DSP), very precise measurements of pulse width and pulse arrival time can be obtained.

Figure 3A:
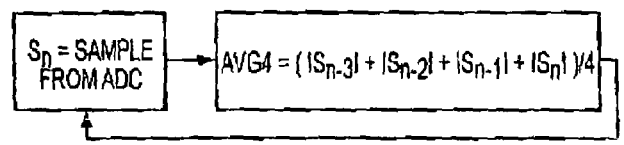
FIG. 3 is a block diagram of a control process according to the invention.
Figure 3B:
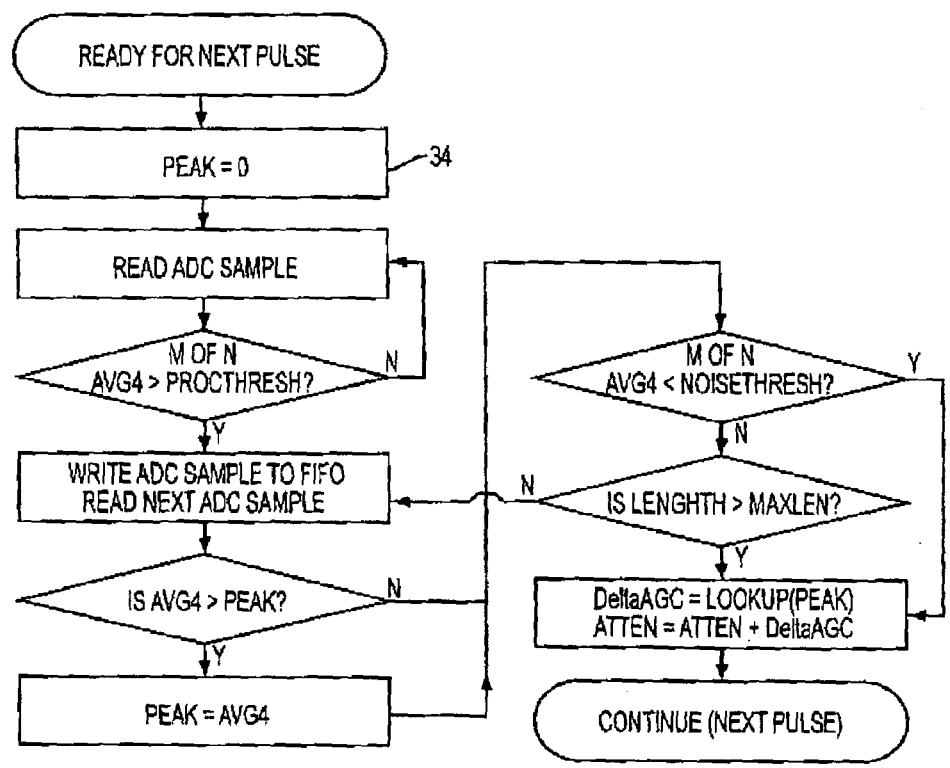
Figure 5:
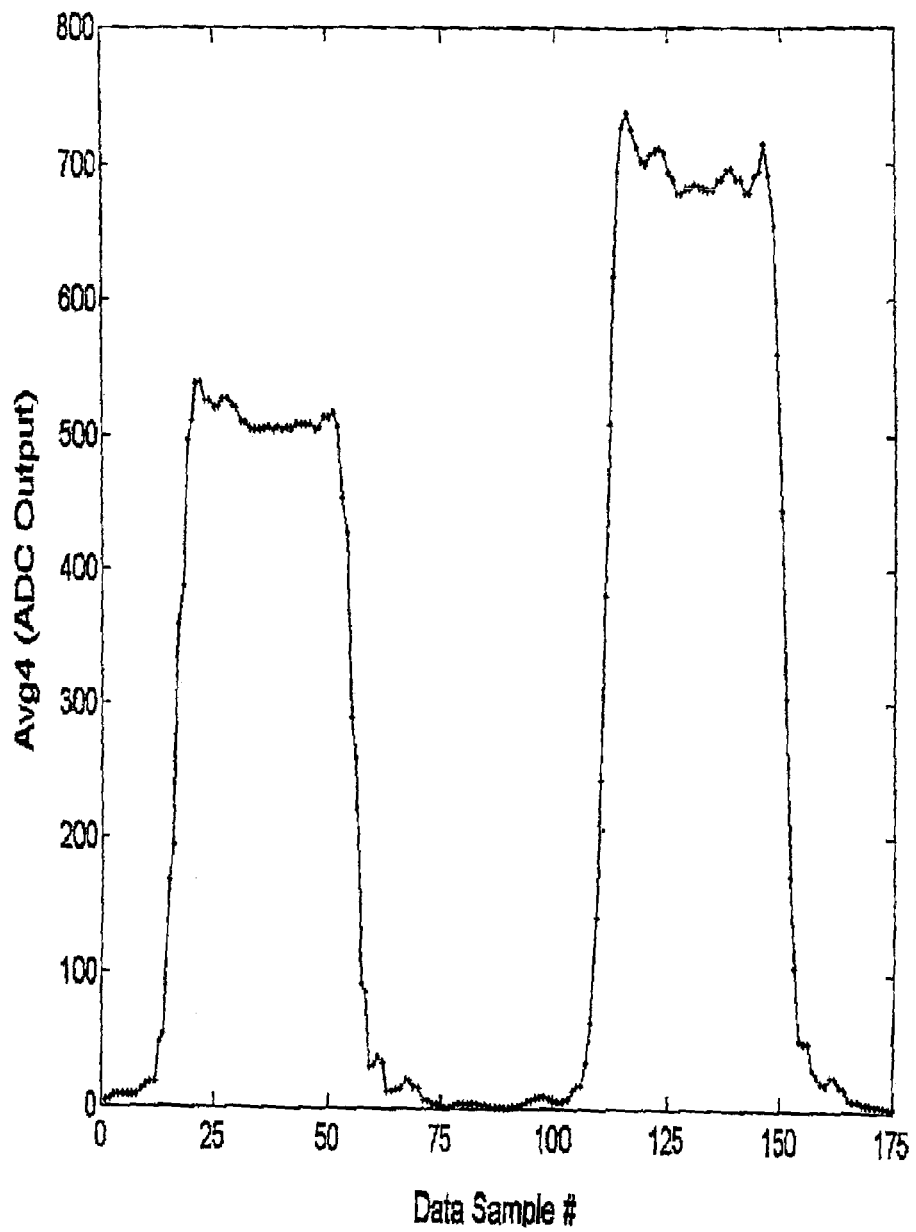
FIG. 5 is a graph illustrating the four-point moving average of the data in FIG. 4.

FIGS. 3a and b show a flowchart view of the AGC process that is implemented by logic circuit 20. Within threshold logic 26, data samples from ADC 18 are continually being used to compute a 4-point moving average (Avg4), as defined in FIG. 3a and illustrated in FIG. 5. These Avg4 values are used for the comparison operations in FIG. 3b. Prior to the front edge detection of the next pulse, a peak register 34 of registers 32 is zeroed out. Each Avg4 value is compared to a processing threshold, ProcThresh, a user-defined value stored in registers 32. For the sake of noise immunity, threshold logic 26 looks for m out of n consecutive Avg4 values to be above ProcThresh before proceeding.

Then, the ADC samples are saved into FIFO 22 until such time as i out of j Avg4 values are below NoiseThresh, signifying the end of the pulse. NoiseThresh is another user-defined value stored in registers 32. The integer values i, j, m and n are to be chosen by the designer while weighing the engineering tradeoff between achieving good noise immunity yet not degrading the detection of short pulses. Should a pulse last longer than a preset timeout value (MaxLen), writing to the FIFO is halted so that the FIFO does not overflow. During each pulse, the highest Avg4 value gets stored into the Peak register.

Upon detecting the trailing edge of each pulse, the peak amplitude value of that pulse is used to look up an attenuation delta value from the LUT. The delta value is added to the current value of the attenuator in order to achieve AGC, keeping the signal within the desired input voltage range of the ADC. The LUT is an attenuation delta table that contains both positive and negative values, and the entries are chosen in such a way as to maintain the signal at a desired amplitude value below full scale on the ADC. It is desirable to maintain a certain amount of ADC headroom, the optimal value of which will depend upon the intended operating environment. For example, if the pulse-to-pulse amplitude variation is not expected to be more than 6 dB, the designer might choose a headroom target of 7 db and create an attenuation delta table to achieve that target.

The thresholds ProcThresh and NoiseThresh are user-defined levels, where ProcThresh is always greater than NoiseThresh. Using this type of dual threshold approach creates a hysteresis condition to ensure that pulses will not be truncated. Optimum threshold values will vary, depending upon the level of the system noise floor and upon the amount of noise in the signal environment.

Obviously many modifications and variations of the present invention are possible in the light of the above teachings. It is therefore to be understood that the scope of the invention should be determined by referring to the following appended claims.

I claim:

1. An automatic gain control radio frequency (RF) signal processor, comprising:
    an attenuator having an input for receiving an analog RF input signal, an output for applying an attenuated output signal, and a variable gain control input;
    an amplifier having an input coupled to the attenuator output and an output;
    a bandpass filter having an input coupled to the amplifier output and an output;
    a single analog to digital (ADC) having an input coupled to the bandpass filter output and an output for providing a digitized ADC signal;
    a digital logic circuit having an Input for receiving the ADC signal, a first output coupled to the variable gain control Input of said attenuator, and a second output, said digital logic circuit including signal detection logic for detecting the presence of a pulse within the ADC signal, determining a peak amplitude value of the pulse, and based on the peak amplitude value generating an attenuation value at said first output that is applied to the variable gain control input of said attenuator; and
    a first in first out (FIFO) buffer having an input coupled to the second digital logic circuit output and an output for producing an attenuated, gain controlled, digitized output.

2. A processor as in claim 1, wherein the RF input signal is an intermediate frequency (IF) signal.

3. A processor as in claim 1, wherein the signal detection logic comprises:
    a Threshold logic for detecting the presence of a pulse within the ADC signal; and
    a control logic for generating said attenuation value and for controlling a flow of data into the FIFO.

4. A processor as in claim 3, wherein the RF input signal is an intermediate frequency (IF) signal.

5. A processor as in claim 1, wherein the digital logic circuit further comprises a digital delay at said second digital logic circuit output.

6. A processor as in claim 5, wherein the signal detection logic comprises:
    a threshold logic for detecting the presence of a pulse within the ADC signal; and
    a control logic for generating said attenuation value and for controlling a flow of data into the FIFO.

7. A processor as in claim 6, wherein the RF input signal is an IF signal.

8. A processor as in claim 1, wherein the signal detection logic includes storing a desired number of samples before the RF signal is detected and a desired number of samples after the RF signal is stored in the FIFO.

9. A processor as in claim 1, wherein a final data sample associated with the RF signal includes a unique bit pattern recognized by the FIFO.

10. A method of processing a radio frequency (RF) input signal, comprising the steps of:
    (a) receiving said RF signal;
    (b) inputting the RF signal to an attenuator to produce an attenuator output;
    (c) applying the attenuator output to an amplifier while controlling a variable gain in the attenuator to produce a controlled amplified output;
    (d) passing the amplified output through a bandpass filter to produce a filtered RF output;
    (e) applying the filtered RF output to an analog to digital (ADC) to produce a digitized output signal;
    (f) applying the digitized output signal to a signal detection logic to determine an attenuation value and to produce a delayed output signal;
    (g) repeating steps (a)–(f) for each of a plurality of ADC data samples;
    (h) establishing a threshold for detecting the presence of a pulse within the plurality of ADC data samples;
    (i) applying the delayed output signal to a buffer to produce a buffered signal output;
    (j) controlling a flow of data into the buffer; and
    (k) applying the attenuation value to the attenuator to establish an updated attenuation gain value.

11. A method of processing a radio frequency (RF) input signal, comprising the steps of:
    (a) receiving said RF signal;
    (b) inputting the RF signal to an attenuator to produce an attenuator output;
    (c) applying the attenuator output to an amplifier while controlling a variable gain the attenuator to produce a controlled amplified output;
    (d) passing the amplified output through a bandpass filter to produce a filtered RF output;
    (e) applying the filtered RF output to an analog to digital (ADC) to produce a digitized output signal;
    (f) applying the digitized output signal to a signal detection logic to determine an attenuation value and to produce a delayed output signal;
    (g) repeating steps (a)–(f) for each of a plurality of ADC data samples;
    (h) establishing a threshold for detecting the presence of a pulse within the plurality of ADC data samples;
    (i) averaging a number of data samples from the ADC to determine a moving average pulse amplitude;
    (j) applying the delayed output signal to a buffer to produce a buffered signal output; and
    (k) applying the attenuation value to the attenuator to establish an updated attenuation gain value.

12. A method as in claim 11, further comprising the step of comparing the moving average pulse amplitude to a processing threshold value.

13. A method as in claim 12, further comprising repeating for a number n samples the steps of averaging a number of data samples from the ADC and comparing the moving average pulse amplitude to a processing threshold value to determine whether an assigned number m of the n averages are above the processing threshold value.

14. A method as in claim 13, further comprising the step of signifying the end of the pulse when an assigned number i out of j averages are below the processing threshold value.

15. A method as in claim 14, wherein the moving average is computed using four data samples.

16. A method as in claim 14, wherein the end of pulse is signified when i of j averages are below a noise threshold value.

17. An automatic gain control radio frequency (RF) signal processor, comprising:

an attenuator having an input for receiving an analog RF input signal, an output for applying an attenuated output signal, and a variable gain control input;

an amplifier having an input coupled to the attenuator output and an output;

a bandpass filter having an input coupled to the amplifier output and an output;

a single analog to digital (ADC) having an input coupled to the bandpass filter output and an output for providing a digitized ADC signal;

a first in first out (FIFO) buffer having an input and an output for producing an attenuated, gain control, digitized output; and a digital logic circuit having an input for receiving the ADC signal, a first output coupled to the variable gain control input of said attenuator, and a second output coupled to the buffer input, said digital logic circuit including signal detection logic, and said signal detection logic comprising:

a field programmable gate array including a threshold logic for detecting the presence of a pulse within the ADC signal; and a control logic for determining a peak amplitude value of the pulse, and based on the peak amplitude value generating an attenuation value at said first output that is applied to the variable gain control input of said attenuator, said control logic further controlling a flow of data into the buffer.

18. An automatic gain control radio frequency (RF) signal processor, comprising:

an attenuator having an input for receiving an analog RF input signal, an output for applying an attenuated output signal, and a variable gain control input;

an amplifier having an input coupled to the attenuator output and an output;

a bandpass filter having an input coupled to the amplifier output and an output;

a single analog to digital (ADC) having an input coupled to the bandpass filter output and an output for providing a digitized ADC signal;

a first in firsIt out (FIFO) buffer having an input and an output for producing an attenuated, gain control, digitized output; and a digital logic circuit having an input for receiving the ADC signal, a first output coupled to the variable gain control input of said attenuator, and a second output coupled to the buffer input, said digital logic circuit including signal detection logic, and said signal detection logic comprising:

a threshold logic for detecting the presence of a pulse within the ADC signal; and a control logic for determining a peak amplitude value of the pulse, and based on the peak amplitude value generating an attenuation value at said first output that is applied to the variable gain control input of said attenuator, wherein the control logic utilizes stored peak amplitude values of one or more previously detected pulses in order to better predict the required attenuation value, said control logic further controlling a flow of data into the buffer.

19. A processor as in claim 17, wherein the RF input signal is an intermediate frequency (IF) signal.

* * * * *